(12) United States Patent
Fukushima et al.

(10) Patent No.: US 7,098,145 B2
(45) Date of Patent: Aug. 29, 2006

(54) FABRICATION OF SELF-ASSEMBLED MONOLAYERS

(75) Inventors: Hitoshi Fukushima, Suwa (JP); Satoru Miyashita, Suwa (JP); Masaya Ishida, Suwa (JP); Andrew Holmes, Cambridge (GB); Wilhelm Huck, Cambridge (GB); Christine K Luscombe, Cambridge (GB)

(73) Assignee: Seiko Epson Corporation, (JP)

( * ) Notice: Subject to any disclaimer, the term of this patent is extended or adjusted under 35 U.S.C. 154(b) by 405 days.

(21) Appl. No.: 10/006,794

(22) Filed: Dec. 4, 2001

(65) Prior Publication Data

US 2002/0197879 A1    Dec. 26, 2002

Related U.S. Application Data

(63) Continuation-in-part of application No. 10/005,175, filed on Dec. 3, 2001, now abandoned.

(30) Foreign Application Priority Data

Dec. 4, 2000    (GB) ................... 0029535.2

(51) Int. Cl.
H01L 21/31    (2006.01)
H01L 21/469    (2006.01)
C23C 16/00    (2006.01)

(52) U.S. Cl. .................. 438/758; 438/780; 427/250; 427/255.17

(58) Field of Classification Search ............... 438/758, 438/780; 427/250, 255.17
See application file for complete search history.

(56) References Cited

U.S. PATENT DOCUMENTS 5,108,799 A * 4/1992 Hoy et al. .................. 427/422
6,183,815 B1 * 2/2001 Enick et al. ................ 427/400
6,413,574 B1 * 7/2002 Romack et al. ............ 427/2.14

FOREIGN PATENT DOCUMENTS

| JP | 8-88402 | 4/1996 |
| JP | 10-217457 A | 8/1998 |
| JP | 11-15000 | 1/1999 |
| WO | 99/038695 | 8/1999 |

OTHER PUBLICATIONS

H. Fukushima and 2 others, "Microstructure, Wettability, and Thermal Stability of Semifluorinated Self-Assembled Monolayers (SAMs) on Gold" J. Phys. Chem. B 2000, 104, pp. 7417-7423.
Notification of Reasons of Rejection dated Jun. 8, 2005 in corresponding Japanese application No. JP2001-370544.

* cited by examiner

Primary Examiner—Alexander Ghyka
(74) Attorney, Agent, or Firm—Harness, Dickey & Pierce, P.L.C.

(57) ABSTRACT

A self-assembled monolayer (SAM) is fabricated using either a semi-fluorinated sulphur containing compound, or a sem-fluorinated silane derivative and compressed carbon dioxide ($CO_2$) as the solvent medium. The temperature and/or pressure of the compressed $CO_2$ may be varied during the fabrication process to improve the molecular packing density of the monolayer.

Figure 1:
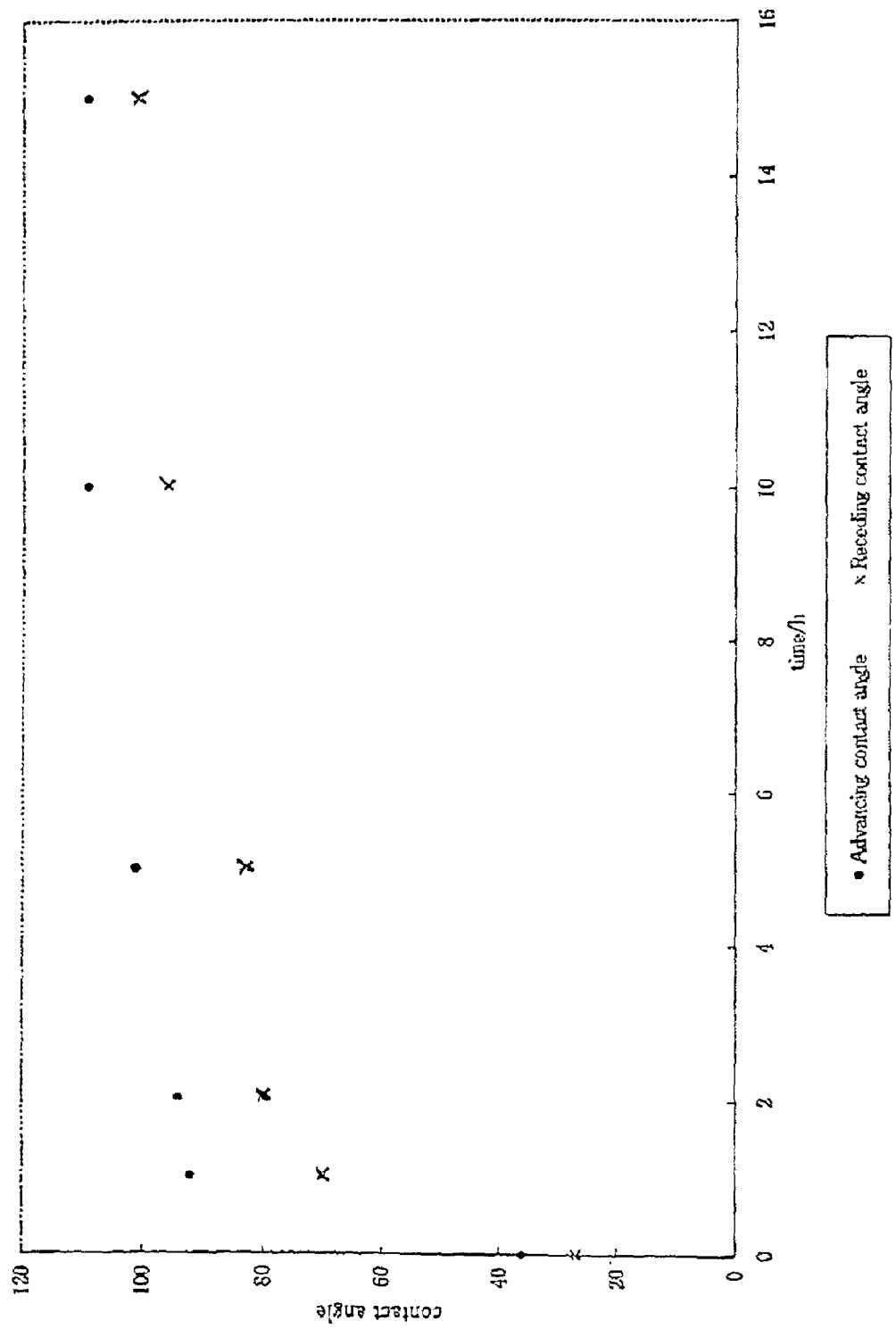

By using compressed $CO_2$ as the solvent medium, monolayers with good molecular packing density can be fabricated relatively quickly without the use of environmentally unfriendly solvents.

23 Claims, 1 Drawing Sheet

FABRICATION OF SELF-ASSEMBLED MONOLAYERS

This application is a Continuation-In-Part of a parent application Ser. No. 10/005,175, entitled FABRICATION OF SELF-ASSEMBLED MONOLAYERS filed on Dec. 3, 2001, now abandoned, by Hitoshi FUKUSHIMA et al.

The present invention relates to a method of fabricating self-assembled monolayers onto a substrate and to products including such monolayers.

Self-assembled monolayers (SAMs) have attracted much attention in areas such as device engineering because of the versatility they provide for surface modification. SAMs are highly ordered molecular assemblies that form spontaneously by chemisorption of functionalised molecules on a variety of substrates such as metals, Indium Tin Oxide (ITO), silicon, and glass. These molecules organise themselves laterally, most commonly via van der Waals interactions between long aliphatic chains. The principles and practice of deposition of monolayers are described in detail in a publication by A Ulman entitled "Introduction to Thin Organic Films: From Langmuir-Blodgett to Self-Assembly", published by Boston Academic Press, 1991. SAMs have found widespread research interest because of potential applications related to control over wettability, biocompatibility and corrosion resistance of surfaces.

For many electronic, optical and electro-optical devices for example, the ability to modify the properties of surface areas of the devices makes SAMs attractive for many applications, such as modification of surface hydrophobicity, packaging and electrical insulation. Furthermore, as SAMs exhibit excellent barrier properties, they are considered very appropriate for use as protective coatings on metal surfaces because they form thin highly crystalline barrier films. Gold has found widespread application and, for example, is used extensively in the electronics industry in integrated circuit technology. Also, as a relatively inert metal it has also been used as a protective layer in certain chemical environments, such as a liner material for the ink chambers in ink jet print heads. However, gold will dissolve under appropriate chemical or electrochemical conditions, so the ability of SAMs to provide a very thin protective layer to such metal layers in harsh chemical environments where metal layer corrosion is known to occur is also considered extremely attractive. However, SAMs have been found to exhibit certain drawbacks which, to date, have severely limited their commercial application in industrial processes.

To date, the SAM material is deposited by dissolving the material in an appropriate solvent and, as such, the monolayer formation over the required flat surface areas, which usually include surface discontinuities arising from design features dictated by the practical application of devices, is difficult to control. As the layers are self aligning, they often exhibit molecular sized defects or holes in the layer. These defects can limit their use as barrier or passivation layers in certain industrial applications because the barrier properties provided by the densely packed molecules of the SAM material can be breached through the molecular sized defects.

Furthermore, although SAMs are typically in the order of only about 2 nm thickness, they are relatively slow to deposit. Typical deposition times range from several hours to a few days with the normal solvents used for the compounds. Heavily fluorinated compounds, such as thiols carrying aliphatic tails with multiple fluorine substituents, have been used to form very hydrophobic SAMs on gold substrates. A measure for the hydrophobicity of a surface is the contact angle between a drop of water and that surface. Contact angles for water on fluorinated SAM surfaces can be as high as 125°. These SAMs are quite robust and are stable up to 150° C. as described by Fukushima et al in The Journal of Physical Chemistry, B, (2000) 104, pages 7417 to 7423, so it can be appreciated that such monolayers could find widespread industrial application if the concerns associated with fabrication can be met.

However, such heavily fluorinated compounds are rather insoluble in most organic solvents but can be processed in halogenated or perfluorinated solvents e.g. dichloromethane, trifluoromethanol, or perfluoroalkanes. The use of such perfluorinated solvents in combination with other immiscible solvents for synthesis has been termed 'fluorous biphase chemistry'. Disadvantages of these solvents include their toxicity, price and adverse impact on atmospheric chemistry. SAMs have also been fabricated on silicon substrates using semi-fluorinated silane derivatives. However, SAMs of these compounds are usually deposited by way of a vapour deposition process which is very time consuming.

These very significant concerns, and in particular those relating to the types of solvents used and their long deposition times, have severely restricted the practical adoption of SAMs in industrial applications. This is particularly surprising when considering the significant benefits that are known to accrue from the use of SAMs.

Compressed carbon dioxide ($CO_2$) is known to be a clean and versatile solvent medium for a wide range of materials, including heavily fluorinated compounds. Supercritical $CO_2$ has been used for polymer synthesis and polymer processing. Such use is described in an article by A Cooper entitled "Polymer Synthesis and Processing using Supercritical Carbon Dioxide", published in The Journal of Materials Chemistry, 2000, 10, pages 207 to 234. A supercritical fluid may be defined as a substance for which both temperature and pressure are above the critical values for the substance and which has a density close to or higher than its critical density. For $CO_2$, the critical density is recognised to be 0.47 g cm$^{-3}$, and the critical temperature and pressure are recognised to be 31.1° C. and 73.8 bar. Compressed $CO_2$ has also been proposed as a solvent for the preparation of organic molecules, as described in a Special Issue of Chemical Review, 1999, 99 Volume 2.

U.S. Pat. No. 5,725,987 describes a process for the preparation of toner additives in which the additives are surface treated using supercritical $CO_2$. The additives are usually in the form of fine powders with particle sizes in the range of from about 5 to about 500 nanometers and they are treated to render the particles hydrophobic and more suitable for use as a toner binder. U.S. Pat. No. 5,725,987 describes, therefore, one application in which supercritical $CO_2$ can be used as a solvent for a coating composition; in this instance, a coating composition used to coat very small size colloidal particles.

Dispersing agents that are similar to the surfactants described in the context of the present invention, but lacking the chemical functionalities to adhere to solid surfaces, have been used in the reactions described above. U.S. Pat. No. U.S. Pat. No. 5,780,565, U.S. Pat. No. 5,733,964 and U.S. Pat. No. 5,840,620 disclose the use of dispersing agents in polymerisation, polymer processing and olefin metathesis reactions, respectively. Additionally, a thiolated fluorocarbon (1H,1H,2H,2H-perfluorodecanethiol) has been used as a stabilising agent in the production of gold colloids in aqueous acetone. The resulting fluorocarbon coating is able to facilitate the dispersion of the nanoclusters in compressed $CO_2$. This process is described by Shah et al in the Journal of American Chemical Society (2000 122, 4245). This is another example of the well known ability of fluorinated surfactants to stabilise dispersions in carbon dioxide. Moreover, the chemical modification of metal oxide particles with organosilane compounds in supercritical carbon dioxide was demonstrated to render the susceptible properties of surfaces into stable and intact dispersed conditions. This method was described by Combes et al in Langmuir (1999 15, 7870). The formation of SAMs in compressed $CO_2$ is suggested in some documents. Specifically, deposition of SAMS in $CO_2$ onto silicon is disclosed. Formation of monolayers is noted in column 1, line 4, p. 842: 218th ACS National Meeting, New Orleans, August 1999, "Formation of Trialkylsilyl Monolayers on Si(100) Using Organosilanes in Carbon Dioxide," C. Cao and T. J. McCarthy, Polym. Prepr., 1999, 39 (2) 841. It describes the deposition of a range of organo-silanes on silicon (100) and is potentially novelty damaging at least for silicon surfaces. This work is in a full paper in "Reactions of Organosilanes with Silica Surfaces in Carbon Dioxide" C. Cao, A. Y. Fadeev and T. J. McCarthy, Langmuir, 2001, 17, 757 (publication date on web Jan. 3, 2001).

It has now been realised with the present invention that compressed $CO_2$ can advantageously be used as a solvent for the preparation of monolayers. This is particularly beneficial because it is inexpensive, non-toxic and non-flammable. Additionally, unlike conventional liquid solvents, compressed $CO_2$ is highly compressible and the density (and therefore solvent properties) can be tuned over a wide range by varying the pressure.

The present invention seeks to provide, therefore, a method that uses compressed $CO_2$ as a solvent to form self-assembled monolyers based on multiple fluorinated compounds, for example, to generate hydrophobic surfaces. The improved solubility of the fluorinated compounds facilitates the interaction of these molecules with the substrate and hence facilitates the formation of the SAMs. This is considered particularly important with SAMs where the surface integrity of the monolayers, i.e not exhibiting molecular sized defects in the extremely thin layer, is considered to be of paramount importance. Additionally, with the present invention, the speed at which the various SAMs can be formed over the required flat surfaces has been found to particularly beneficial. Good quality SAMs can be fabricated in a matter of minutes to hours, rather than conventional preparation times of several hours to days with the use of conventional solvents.

Further advantages are also provided in that these surfaces can be made heat and solvent resistant, and their deposition avoids the use of environmentally unfriendly solvents.

According to a first aspect of the present invention, there is provided a method of fabricating a self-assembled monolayer of a substance on a substrate comprising depositing the substance on the substrate using compressed carbon dioxide as the solvent medium for the substance.

Advantageously, the pressure and/or temperature of the compressed carbon dioxide is/are selectively controlled so as to enhance the density of the self-assembled monolayer on the substrate.

Preferably, a co-solvent is used in combination with the compressed carbon dioxide.

In a preferred embodiment, the substrate comprises a metallic substance such as gold silver, copper, iron, mercury, palladium, gallium arsenide, ferrous oxide, indium tin oxide.

Most preferably, the substance comprises a semi-fluorinated sulphur containing compound having a formula as defined in claim 7 appended hereto.

In an alternative embodiment the substrate comprises at least one of glass, mica, $SiO_2$, $Al_2O_3$, $Ga_2O_3$ or ITO.

Preferably, the substance comprises a semi-fluorinated silane derivative having a formula as defined in claim 17 appended hereto.

In an alternative aspect of the present invention, there is provided an inkjet head comprising a self-assembled monolayer in accordance with the first aspect of the invention as defined above.

In a further aspect of the present invention, there is provided an electronic, optical or optoelectronic device comprising a self-assembled monolayer in accordance with the first aspect of the invention defined above.

Preferably, the device may comprise a thin film transistor, an organic semi-conductor device, or a light emitting diode, which advantageously may be an organic polymer light emitting diode.

The present invention will now be described by way of further example only.

SAMs have been fabricated on metallic, glass and silicon type substrates. For metallic substrates, which may consist of a layer of Au, Ag, Cu, Pd, Fe, Hg, GaAs, ITO, or $Fe_2O_3$ on a suitable supporting medium, the SAM may typically comprise a substance including semi-fluorinated sulphur-containing compounds of the formula:

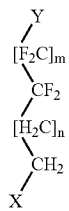

wherein X can be (but is not necessarily limited to) R—SH, RS—SR, or R—S—R (where R denotes the rest of the molecule). Preferably, disulphides are used and most preferably X is a thiol.

The numbers m and n denote the number of fluorinated and non-fluorinated carbon atoms, respectively, and lie within the range of 1–20. Preferably, m and n fall within the range of 5–10, and most preferably, m=8 and n=10. Y preferably indicates a $CF_3$ functional group. Y may be further modified to incorporate one or more substituents such as, vinyl, styryl, acryloyl, methacryloyl or alkyne for further functionalisation or cross-linking, with one or more spacer group such as $CH_2$ to facilitate attachment.

Self-assembled monolayers on glass, mica, $SiO_2$, $Al_2O_3$, $Ga_2O_3$ or ITO typically involve semi-fluorinated silane derivatives of the formula:

Wherein Si can be (but is not necessarily limited to) $SiCl_3$, $Si(OCH_3)_3$, $Si(OCH_2CH_2CH_3)_3$, $Si(OCH_3)_2Cl$, or $Si(CH_2CH_3)_2Cl$. Preferably, Si is a trialkoxy derivatives and most preferably, Si is $SiCl_3$. The numbers m and n denote the number of fluorinated and non-fluorinated carbon atoms, respectively, and lie within the range of 1–20. Preferably, m falls within the range of 5–10 and n falls within the range of 5–10 and n falls within the range of 1–5. Most preferably m=6 and n=1. Y preferably indicates a $CF_3$ functional group. Y may be further modified to incorporate one or more substituents such as, vinyl, styryl, acryloyl, methacryloyl or alkyne for further functionalisation or cross-linking, with one or more spacer group such $CH_2$ to facilitate attachment.

According to the method of the present invention, compressed $CO_2$ may also be used to fabricate high denisty self-assembled monolayers of other simple alkane thiols and alkyl silane compounds.

The addition of co-solvents to the carbon dioxide such as $H_2O$, $CH_3OH$, $CF_3OH$, $CF_3CH_2OH$, $CF_3CF_2OH$, $(CF_3)_2CHOH$, $CH_4$, $C_2H_4$, $C_2F_6$, $CHF_3$ $CClF_3$, $C_2H_6$, $SF_6$, Propylene, Propane, $NH_3$, Pentane, $^1PrOH$, MeOH, EtOH, $^1BuOH$, Benzene, Pyridine may also be adopted to provide further improvements in monolayer formation, such as faster and denser packing of the molecules constituting the monolayer.

The use of compressed $CO_2$ to form monolayers ensures that the complete functionalisation process of surfaces is performed without the use of any toxic, flammable or environmentally unfriendly solvents.

The following examples are provided to further explain the present invention:

EXAMPLE 1

Formation of Monolayers on Gold

A gold surface was prepared by evaporation of a 200 nm layer of gold onto a Si-wafer, with a 10 nm layer of Cr as an adhesive layer in between. The freshly evaporated gold surface was placed inside a stainless steel vessel such as that described, for example, by Hems et al in Journal of Materials Chemistry (1999) 9, 1403, together with 5 mg of $CF_3(CF_2)_9(CH_2)_{11}SH$. The vessel was initially filled with liquid $CO_2$ and then gradually heated to 35° C. to obtain the desired temperature and pressure. The mixture was left for approximately 30 minutes. The substrate in the cell was then rinsed by filling the cell two more times with liquid $CO_2$ and subsequent venting. The SAM fabricated in this example exhibited water contact angles of around 110° and an Ellipsometry thickness of around 30 Å.

EXAMPLE 2

Formation of Monolayers on Si

A clean Si wafer was placed inside a stainless steel vessel as described above with respect to Example 1, together with 1H,1H,2H,2H-perfluoredecyltrichlorosilane. The vessel was then filled with liquid $CO_2$ and then gradually heated to 35° C. to obtain the desired temperature and pressure. The mixture was left for approximately 30 minutes. The cell was cooled to room temperature and the $CO_2$ was vented. The substrate in the cell was rinsed by filling the cell two more times with liquid $CO_2$ and subsequent venting. The SAM fabricated in this example exhibited a dynamic water contact angle of around 110°, and an Ellipsometry thickness of around 30Å.

It can be appreciated from examples 1 and 2 above that the monolayers can be fabricated in a relatively short period of time in comparison with known fabrication techniques using perfluorinated solvents. Furthermore, it will be appreciated by those skilled in this art that SAMs fabricated in accordance with the method of the present invention may be used in many applications where it is required to produce a flat impenetrable surface or where it is desirable to change the wettability characteristic of a surface. Hence, such monolayers can advantageously be used in the ink chambers of ink jet print heads to provide a dewetting surface on the gold surface usually provided to line such chambers to assist ejection. Also, being an impenetrable surface, the SAM also provides a protective layer for the gold surface in the corrosive environment found in such chambers arising from heating of the printing inks.

Additionally, SAMs fabricated in accordance with the present invention may also be used to modify the surface of a substrate upon which a thin film of an inorganic or organic material is required to be formed, such as in optical devices, optoelectronic devices, organic semiconductors, thin film transistors, LED or liquid crystal devices.

For semiconductor devices, the silicon substrate may act as a charge injecting layer and the monolayer, whilst providing the required surface structure for the substrate, is an extremely thin layer and hence electric charges required to operate the devices can be readily transmitted through the monolayer from the substrate.

Indium tin oxide (ITO) is a very important transparent conducting electrode which has many applications in liquid crystal technology, in light emitting diodes (where it matches the energy of the highest occupied molecular orbital of many conjugated organic materials), and in organic photovoltaic devices. It has the disadvantage that its work function is variable and its surface roughness is rather large. Advantageously it can be modified by a thin coating of a conducting polymer [polystyrene-sulfonic acid doped poly (ethylenedioxy)-thiophene]. SAMs deposited with control on ITO can be used to modify surface roughness, surface hydrophobicity, contact angle and the potential to act as an alignment layer in liquid crystalline devices. In the present invention it is found that compressed carbon dioxide enables the rapid deposition of SAMs on ITO on glass. Use of conventional organic solvents for SAM deposition on ITO takes several days [I. Markovich and D. Mandler J. Electroanal. Chem., 2001, 500, 453]. Hot microcontact printing on ITO has also been disclosed (Y. Koide, Q. Wang, J. Cui, D. D. Benson and T. J. Marks, J. Am. Chem. Soc., 2000, 122, 11266. In the present invention deposition of perfluorinated silanes as SAMs is found to occur on from compressed carbon dioxide in a matter of hours. This short deposition time is an advantage for industrial manufacture of multilayer devices involving deposition on ITO.

The formation of well-controlled and reproducible SAMs on ITO is not simple, mostly for two major reasons: (i) the high roughness of the ITO and (ii) the low hydroxyl coverage. The latter problem may be overcome by employing a number of pretreatments. These include treatment of ITO using acid followed by base and treatment by piranha solution.

Other parameters that have an effect on SAM formation include the time, temperature and the amount of water present in the silanisation mixture. It has been reported that high temperature of about 70° C. is required for reproducible SAMs on ITO. With this in mind, experiments were carried out four different temperature within the range of 20° C.–80° C. to determine the optimum temperature of SAM formation. These results are presented in Table 1. As one can see it was found that 40° C. was the optimum temperature for SAM formation. Therefore this temperature was used for subsequent reactions.

The time of silanization that has been reported using silanes spans a wide range from less than an hour to several days. It has been reported that in order to obtain reproducible results on ITO, a longer time is required compared to SAM formation on silica (a few days as opposed to a few hours). We also know from our own study that the formation of SAMs in $scCO_2$ is considerably faster than in organic solvents (one hour compared to 24 hours). With this in mind, a time range of 1 hour to 15 hours was chosen (a time longer than that required for SAM formation on silica in $scCO_2$ but a shorter time than that required for SAM formation on ITO in organic solvents).

It is generally accepted that the presence of low concentrations of water is necessary for the formation of a monolayer from trichloroalkylsilane precursor. However, excess water results in facile polymerisation of trichloroalkylsilanes. Studies have shown that $CO_2$ weakly physisorbs to silica and extracts the adsorbed water from surfaces. Therefore, the use of $CO_2$ as a solvent is ideal for monolayer formation on difficult surfaces such as ITO.

Table 1

Contact Angle of Treated ITO vs. Temperature

| Temperature/° C. | Advancing contact angle | Receding contact angle |
| --- | --- | --- |
| 20 | 88 | 47 |
| 40 | 94 | 80 |
| 60 | 62 | 33 |
| 80 | 53 | 29 |

The presence as well as the organisation of an alkyl monolayer can be estimated from contact angle measurements. The contact angle measurements are shown in FIG. 1. The bare ITO water contact angle depends significantly on the pretreatment and can vary between 20° and 80°. In the present example, a value of 36° was obtained which is comparable to those obtained on oxidised surfaces e.g. through oxygen plasma or RCA treatment.

Table 2

Contact Angle of Perfluoroallkylsilane SAMs

| Time/h | Advancing contact angle | Receding contact angle |
| --- | --- | --- |
| 0 | 36 | 27 |
| 1 | 92 | 70 |
| 2 | 94 | 80 |
| 5 | 101 | 83 |
| 10 | 109 | 96 |
| 15 | 109 | 101 |

Cyclic voltammetry measurements confirm the level of surface coverage.

EXAMPLE 3

ITO coated glass was provided by IVC Technologies, UK. The plates were 200 mm×80 mm and had a surface conductivity of 40 □ sq$^{-1}$. Before use, the plates were cleaned by sonication first with acetone (10 min), then with dichloromethane (10 min) and finally with water (2 min, several times). Each slide was placed in an individual vial in which a mixture of 5:1:1 $H_2O+H_2O_2$ (30%)+$NH_3$ (25%) was added and stirred for 1 h at 70° C. using a magnetic stirrer. The slides were then washed carefully with a large amount of water and dried in an oven at 100° C. for 4 h.

After silanisation, advancing and receding contact angles were measure by placing drops (10–20 μL) on the ITO samples. The reported values of the contact angles are the average of three to five drops placed on each sample. The variation of the contact angle from spot to spot never exceeded 2–4°. A clean ITO on glass sheet placed inside a stainless steel vessel such as that described in Example 1 together with 1H, 1H, 2H, 2H-perfluorodecyltrichlorosilane (4 μL). The vessel was initially filled with liquid $CO_2$ and then gradually heated to 40° C. to obtain the required temperature and pressure (40° C., 1500 psi). The mixture was then left for 2 h. The substrate in the cell was then rinsed by filling the cell ten more times with liquid $CO_2$ and subsequent venting. The treated ITO plate was then placed in a dessicator until required.

Although the present invention has been described with reference to compressed carbon dioxide, it is to be appreciated that the method of the present invention can also be used under temperature and pressure conditions such that the carbon dioxide is in a supercritical condition. Furthermore, compressed carbon dioxide may be used to deposit the substance on the substrate and supercritical carbon dioxide may be used to subsequently enhance the density of the self-assembled monolayer, or vice versa. Therefore, as used in the context of the present invention, including the claims appended hereto, the term compressed carbon dioxide is intended to include also supercritical carbon dioxide.

The aforegoing description has been given by way of example only and it will be appreciated by a person skilled in the art that modifications can be made without departing from the scope of the present invention.

DETAILED DESCRIPTION OF DRAWING

FIG. 1 shows the variation in contact angle of the monolayer according to the embodiment of the present invention.

The invention claimed is:

1. A method of fabricating a layer on a substrate, the method comprising:
   forming the layer, the step of forming the layer including using carbon dioxide; and
   the step of forming the layer including depositing a sulphur-containing compound that includes a moiety represented by the formula:

Y—(CF$_2$)$_m$—CF$_2$—(CH$_2$)n—CH$_2$—X, where X is sulphur,
   Y is a functional group,
   m and n denote a number of fluorinated and non-fluorinated carbon atoms, respectively, and m and n lie within the range of 1 to 20.

2. The method as claimed in claim 1, wherein m and n lie within the range of 5 to 10.

3. The method as claimed in claim 2, where m is 8 and n is 10.

4. The method as claimed in claim 1, wherein Y further includes at least one of vinyl, styryl, acryloyl, methacryloyl and alkyne in combination with a spacer group.

5. The method as claimed in claim 4, wherein the spacer group includes at least one of $CH_2$ and $CF_2$.

6. The method as claimed in claim 1, wherein the substrate includes at least one of gold, silver, copper, iron, mercury, palladium, gallium arsenide, ferrous oxide, and indium tin oxide.

7. A method of fabricating a layer on a substrate, the method comprising:
   forming the layer, the step of forming the layer including using carbon dioxide; and
   the step of forming the layer including depositing a silicon containing compound that includes a moiety represented as the formula:

$Y—(CF_2)_m—CF_2—(CH_2)_n—CH_2—Si$, where Y is a functional group;
   m and n denote respectively the number of fluorinated and non-fluorinated carbon atoms, respectively; and
   m and n lie within the range of 1 to 20.

8. The method as claimed in 7, wherein the compound has an alkoxy group on the Si atom.

9. The method as claimed in claim 8, wherein the compound has a chlorine atom on the Si atom.

10. The method as claimed in claim 7, wherein Y includes a $CF_3$ functional group.

11. The method as claimed in claim 7, wherein the substrate includes at least one of glass, mica, $SiO_2$, $Al_2O_3$, $Ga_2O_3$, and ITO.

12. The method as claimed in claim 11, wherein m and n lie within the range of 5 to 10.

13. The method as claimed in claim 12, wherein m is 6 and n is 1.

14. The method as claimed in claim 7, wherein Y further includes at least one of vinyl, styryl, acryloyl, methacryloyl and alkyne in combination with a spacer group.

15. The method as claimed in claim 14, wherein the spacer group includes at least one of $CH_2$ or $CF_2$.

16. The method as claimed in claim 1, wherein the layer has an ellipsometry thickness of about 30 Å and a water contact angle of about 110°.

17. The method as claimed in claim 7, wherein the layer has an ellipsometry thickness of about 30 Å and a water contact angle of about 110°.

18. The method according to claim 1, the step of forming the layer including using a supercritical condition.

19. The method of claim 1, the step of forming the layer including using a co-solvent in combination with carbon oxide.

20. The method as claimed in claim 19, wherein the co-solvent comprises at least one of $H_2O$, $CH_3OH$, $CF_3OH$, $CF_3CH_2OH$, $CF_3CF_2OH$, $(CF_3)_2CHOH$, $CH_4$, $C_2H_4$, $C_2F_6$, $CHF_3$ $CClF_3$, $C_2H_6$, $SF_6$, propylene, propane, $NH_3$, pentane, $^iPrOH$, MeOH, EtOH, $^tBuOH$, benzene, and pyridine.

21. The method according to claim 7, the step of forming the layer including using a supercritical condition.

22. The method according to claim 7, the step of forming the layer using a co-solvent in combination with carbon oxide.

23. The method as claimed in claim 22, wherein the co-solvent comprises at least one of $H_2O$, $CH_3OH$, $CF_3OH$, $CF_3CH_2OH$, $CF_3CF_2OH$, $(CF_3)_2CHOH$, $CH_4$, $C_2H_4$, $C_2F_6$, $CHF_3$ $CClF_3$, $C_2H_6$, $SF_6$, propylene, propane, $NH_3$, pentane, $^iPrOH$, MeOH, EtOH, $^tBuOH$, benzene, and pyridine.

* * * * *

UNITED STATES PATENT AND TRADEMARK OFFICE
CERTIFICATE OF CORRECTION

PATENT NO.         : 7,098,145 B2
APPLICATION NO. : 10/006794
DATED              : December 4, 2001
INVENTOR(S)       : Hitoshi Fukushima et al.

Page 1 of 1

It is certified that error appears in the above-identified patent and that said Letters Patent is hereby corrected as shown below:

On the title page, item [73]:
    After "Assignee: Seiko Epson Corporation (JP)",
    please insert --Cambridge University Technical Services Limited (UK)--

Signed and Sealed this

Sixteenth Day of June, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,098,145 B2  Page 1 of 1
APPLICATION NO. : 10/006794
DATED : December 4, 2001
INVENTOR(S) : Hitoshi Fukushima et al.

It is certified that error appears in the above-identified patent and that said Letters Patent is hereby corrected as shown below:

On the title page, item [73]:
    After "Assignee: Seiko Epson Corporation (JP)",
    please insert --Cambridge University Technical Services Limited (UK)--

Signed and Sealed this

Fourteenth Day of July, 2009

JOHN DOLL
*Acting Director of the United States Patent and Trademark Office*